United States Patent
Yu

Patent Number: 5,998,245
Date of Patent: Dec. 7, 1999

[54] METHOD FOR MAKING SEAL-RING STRUCTURE WITH ESD PROTECTION DEVICE

[75] Inventor: Ta-Lee Yu, Hsinchu Hsien, Taiwan

[73] Assignee: Winbond Electronics Corporation, Hsinchu, Taiwan

[21] Appl. No.: 09/044,211

[22] Filed: Mar. 18, 1998

[51] Int. Cl.$^6$ .................................................. H01L 21/332
[52] U.S. Cl. .............................................. 438/140; 438/10
[58] Field of Search ........................... 438/140, 151–164, 438/237, 275–291, 10

[56] References Cited

U.S. PATENT DOCUMENTS 5,707,886  1/1998  Consiglio et al. .
5,733,794  3/1998  Gillbert et al. .

Primary Examiner—Jey Tsai
Attorney, Agent, or Firm—Proskauer Rose LLP

[57] ABSTRACT

The ESD circuit of the present invention comprises a protection device, and output circuitry. The ESD circuitry illustratively comprises an NMOS and PMOS transistor and two protective diodes. However, in place of the NMOS and PMOS transistors, any two-terminal protection device may be used. The protection device of the present invention comprises the diodes of the ESD circuitry. These diodes are formed within the seal-ring structure of an IC. The seal-ring structure is formed using the following steps. First, a field oxide is grown. N$^+$ and P$^+$ impurities are diffused into the substrate. An insulating layer is then grown over the oxide, P$^+$, and N$^+$ regions. The insulating layer is etched back, uncovering the substrate, P$^+$ region, and a portion of the N$^+$ region. Similarly, a thick aluminum layer is deposited and etched back to form a first connection layer. Subsequently, an insulating layer is formed over the first insulating layer. A second thick aluminum layer is then deposited and etched to form the second connection layer.

5 Claims, 8 Drawing Sheets

METHOD FOR MAKING SEAL-RING STRUCTURE WITH ESD PROTECTION DEVICE

FIELD OF THE INVENTION

The present invention relates to a protection device and, more particularly, relates to a protection device for an electro-static discharge element used in integrated circuits, having a modified seal-ring structure.

BACKGROUND OF THE INVENTION

Integrated circuits (IC's) often suffer from a lack of robustness with respect to ESD. As technology allows IC's to be scaled down into the submicron regime, various structures and processes, for example, in CMOS technology, such as thinner gate oxide, shorter channel length, shallower source/drain junction, LDD (Lightly Doped Drain) structures, and solicited diffusion, degrade the ESD robustness of IC's. (see e.g. C. Duvvury and A. Amerasekera, "ESD: A pervasive reliability concern for IC technologies," in Proc. of IEEE, vol. 81, no. 5. pp. 690–702, May 1993; and A. Amerasekera and C. Duvvury, "The impact of technology scaling on ESD robustness and protection circuit design," 1994 EOS/ESD Symp. Proc., EOS-16, pp. 237–245).

To improve the ESD robustness of a submicron device, some submicron IC technologies offer an additional "ESD Implant" mask in processes to make a stronger device structure for an IC output buffer to protect against ESD damage. However, this results in increased IC fabrication costs.

Another approach to ESD protection in a CMOS output buffer is to provide one or more ESD protection elements between the CMOS output buffer and the output pad to improve the robustness of a submicron CMOS output buffer with respect to ESD.

In Y.-J. B. Liu and S. Cagnina, "Electrostatic discharge protection device for CMOS integrated circuit outputs," U.S. Pat. No. 4,734,752, 1988, a field-oxide (N-type) device is placed in parallel with the thin-oxide NMOS device of the CMOS output buffer from the output pad to VSS (ground) to improve the ESD protection capability of the CMOS output buffer. In T. C. Chan and D. S. Culver, "ESD protection circuit," U.S. Pat. No. 5,329,143, 1994, a lateral N-P-N bipolar transistor is placed in parallel with the thin-oxide NMOS device of the CMOS output buffer from the output pad to ground to improve the ESD protection capability of the CMOS output buffer. However, the turn-on voltages of a parasitic field-oxide device and parasitic lateral N-P-N bipolar transistor are generally higher than that of a short-channel thin-oxide NMOS device in the submicron CMOS output buffer. Thus, the thin-oxide NMOS device will be first turned on when the ESD stress occurs on this output pad. Thus, the improvement of ESD protection by adding the field-oxide device or lateral N-P-N bipolar transistor may be small.

In Scott et al., U.S. Pat. No. 5,019,888, 1991, the large-dimension output thin-oxide NMOS device is separated into many small-dimension NMOS devices in parallel with each other from the output pad to ground. There is a series resistance inserted from the drain of each small-dimension NMOS device to the output pad to improve its ESD robustness.

In G. N. Roberts, "Output ESD protection circuit," U.S. Pat. No. 5,218,222, 1993, a lateral N-P-N bipolar transistor is placed in parallel with the output NMOS device from the output node of the output buffer to ground, and a series resistance is inserted between the output pad and the output node of the output buffer, to improve ESD reliability of the output pad.

In K. F. Lee, A. Lee, M. L. Marmet, and K. W. Ouyang, "Electro-static discharge protection circuit with bimodal resistance characteristics," U.S. Pat. No. 5,270,565, 1993, a thick-oxide device is placed in parallel with the thin-oxide NMOS device in the CMOS output buffer from the output pad to VSS and the drain of the thin-oxide NMOS device in the CMOS output buffer is modified with a series N-well resistor to the output pad, to improve ESD protection capability of the CMOS output buffer.

In Scott et al., U.S. Pat. No. 5,019,888, 1991; G. N. Roberts, "Output ESD protection circuit," U.S. Pat. No. 5,218,222, 1993; and K. F. Lee, A. Lee, M. L. Marmet, and K. W. Ouyang, "Electro-static discharge protection circuit with bimodal resistance characteristics," U.S. Pat. No. 5,270,565, 1993, there are series resistors from the output node of the CMOS output buffer to the output pad. These series resistors could effectively improve ESD robustness of a submicron CMOS output buffer, but they limit the current driving/sinking capability of the CMOS output buffer. The timing for the output signal is also delayed by the series resistors. Thus, the output signal is also delayed by the series resistors. The output driving/sinking capability and output timing may also become outside of the design specifications. This limits the usefulness of an output buffer modified in this way for application in high-speed (minimum delay for input/output signal) and heavy-loading (output buffer of high-driving/sinking capability) CMOS IC's.

Since ESD voltages may have positive or negative polarities on a pin with respect to both VDD (high supply voltage) and VSS (low supply voltage or ground) pins, there are four different ESD-stress cases at an output pad of a CMOS output buffer:

(1) PS mode: ESD stress at an output pin with positive voltage polarity to VSS bus when VDD bus is floating;

(2) NS mode: ESD stress at an output pin with negative voltage polarity to VSS bus when VDD bus is floating;

(3) PD mode: ESD stress at an output pin with positive voltage polarity to VDD bus when VSS bus is floating and;

(4) ND mode: ESD stress at an output pin with negative voltage polarity to VDD bus when VSS bus is floating.

These ESD voltages could damage both NMOS and PMOS devices in the output buffer of CMOS IC's.

The ESD failure threshold voltage of a pin is defined as the lowest ESD-sustaining voltage of the four-mode ESD stresses on the pin. For example, if an output pin can sustain up to 6 KV ESD voltage in PS-, NS-, and PD-mode ESD stresses but it can only sustain 1 KV ESD voltage in the ND-mode ESD stress, the ESD failure threshold voltage for this output pin is defined as 1 KV only. In the references cited above, the ESD protection is emphasized from the output pad to VSS (ground). The additional ESD protection elements are all placed from the output pad to ground in parallel with an output NMOS device. There is no additional ESD protection element arranged between the output pad and VDD. For ND-mode or PD-mode ESD stresses, the PMOS device of the CMOS output buffer (or the output device between VDD and output pad) is sensitive to ESD damage. The overall ESD failure threshold voltage may be not effectively improved. Thus, an effective ESD protection circuit for output buffer of advanced submicron CMOS IC's should provide strong ESD discharging paths from the output pad to both VSS and VDD buses.

FIG. 1 shows a schematic diagram of an ESD protection circuit. The circuit 40 is formed with protective circuitry 10, and output circuitry 30. The protective circuitry 10 also may include any type of two-terminal ESD protection device. Illustratively, NMOS 14 and PMOS 12 transistors are provided for ESD protection. However, as is apparent to one skilled in the art, the protective circuitry 10 may also be achieved using a variety of two-terminal devices. For example, an LVTSCR (Low Voltage Trigger SCR) may be used. Additionally, the protective circuitry 10 also includes a first parasitic diode $D_p$ (22) and a second parasitic diode $D_n$ (24).

The first parasitic diode $D_p$ is connected in parallel with the PMOS device with its anode connected to the output pad and its cathode connected to VDD. The $D_p$ diode is used to protect against PD mode ESD stress. A second parasitic diode $D_n$ is connected in parallel to the NMOS device with its anode connected to VSS and its cathode connected to the output pad. The diode $D_n$ protects against NS mode ESD stress. However, diodes fashioned in this method do not offer sufficient diode area for adequate ESD protection. Further, the costs of such a structure are typically quite high.

It is therefore an object of the present invention to overcome these deficiencies in the prior art. This is accomplished by incorporating an ESD element in a modified seal ring structure. This allows such ESD element to share most of the ESD current during an event to improve ESD protection. In addition, the structure allows the size of the primary ESD circuitry to be reduced.

SUMMARY OF THE INVENTION

These and other objects are achieved by the present invention. According to one embodiment, a very large diode having a high capacitance is provided. This diode is located between Vdd and Vss, and further forms part of an ESD device. Furthermore, the ESD element of the present invention is provided in a modified seal-ring configuration. This structure allows for a large ESD structure, while still allowing the other devices of the ESD circuitry to be made smaller. Further, the fabrication of the diode is simpler. In addition, the seal-ring structure allows a diode to be made with a larger capacitance which improves chip performance? Also, the seal-ring structure provides for greater ESD protection.

The ESD circuit of the present invention comprises a protection device, and output circuitry. The ESD circuitry illustratively comprises an NMOS and PMOS transistor and two protective diodes. However, in place of the NMOS and PMOS transistors, any two-terminal protection device may be used. The protection device of the present invention comprises the diodes of the ESD circuitry. These diodes are formed within the seal-ring structure of an IC. The seal-ring structure is formed using the following steps. First, a field oxide is grown. N+ and P+ impurities are diffused into the substrate. An insulating layer is then grown over the oxide, P+, and N+ regions. The insulating layer is etched back, uncovering the substrate, P+ region, and a portion of the N+ region. Similarly, a thick aluminum layer is deposited and etched back to form a first connection layer. Subsequently, an insulating layer is formed over the first insulating layer. A second thick aluminum layer is then deposited and etched to form the second connection layer.

As described, the inventive diode structure may be fabricated using a conventional CMOS process. Accordingly, there are no additional process steps to form the inventive ESD elements in the seal-ring structure. Conventionally, a seal-ring structure is may be used in a CMOS device for such purposes as protecting the wafer against sawing the scribe lines during packaging. Accordingly, if such seal-ring structure is present in the CMOS device, an ESD element may be formed in the seal-ring structure between Vdd and Vss without additional process steps but while providing high capacitance and high protection between Vdd and Vss.

BRIEF DESCRIPTION OF THE DRAWINGS

The following detailed description, given by way of example and not intended to limit the invention solely thereto, will best be understood in conjunction with the accompanying drawings in which like reference numerals will be used throughout.

DETAILED DESCRIPTION OF THE PREFERRED EMBODIMENTS

Figure 1:
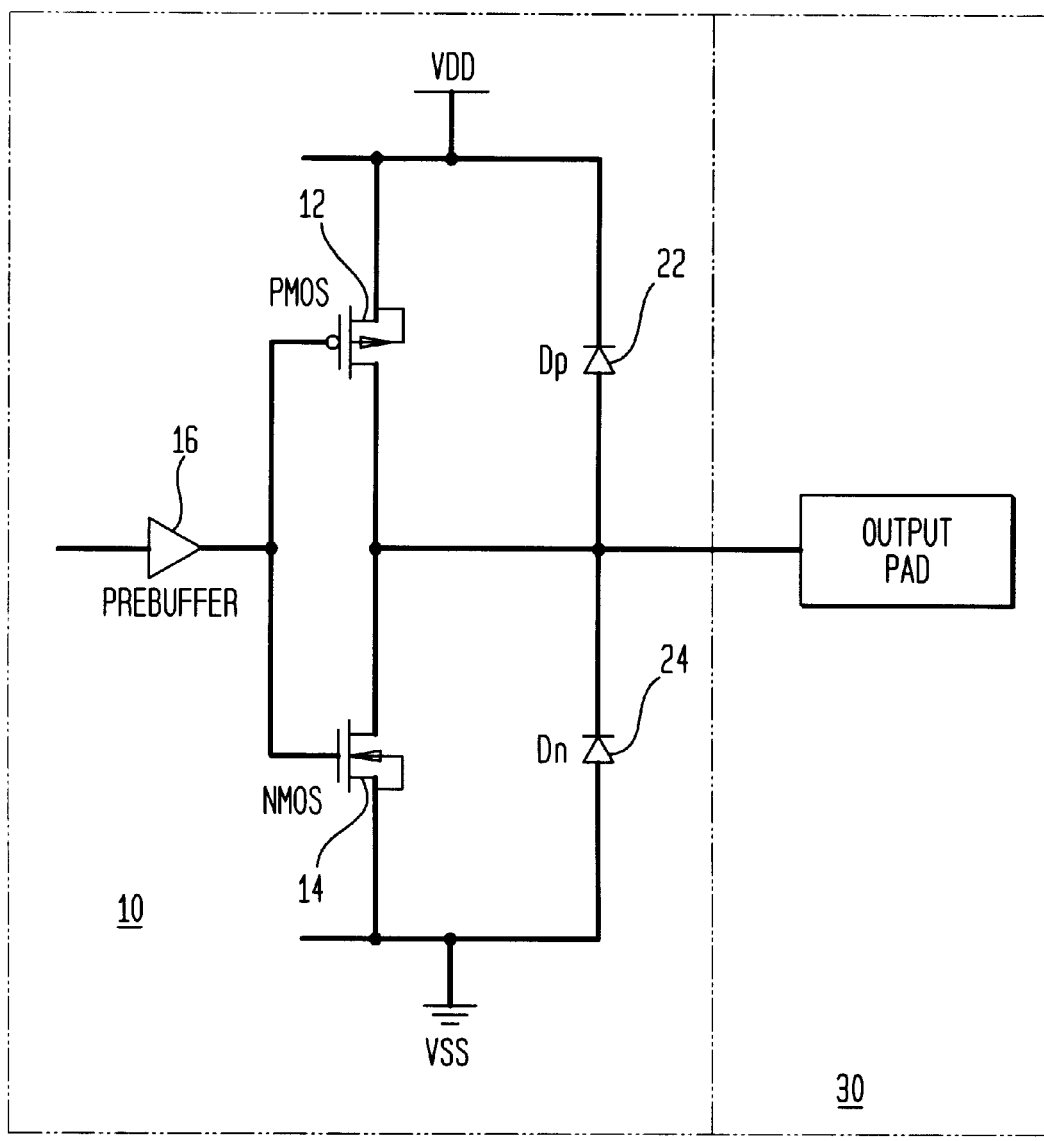
FIG. 1 shows a conventional ESD protection circuit.
Figure 2A:
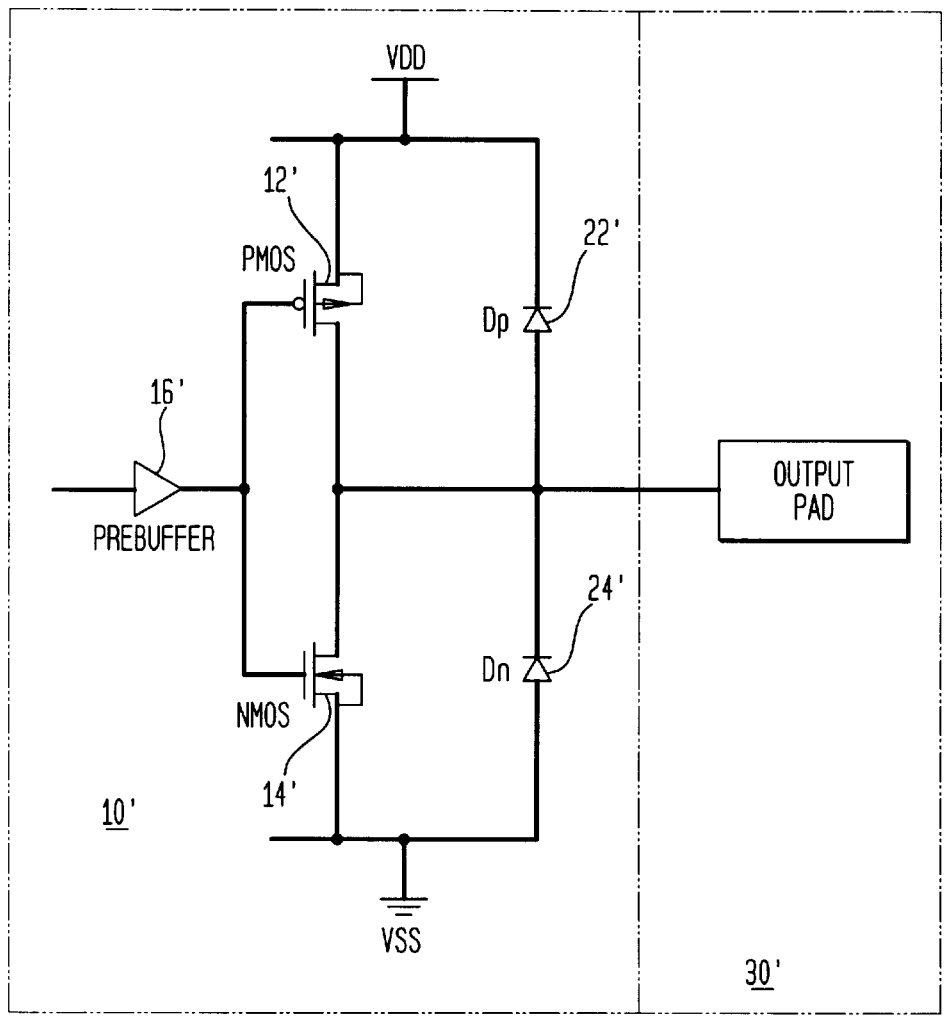
FIG. 2A shows the ESD device of the present invention.
Figure 2B:
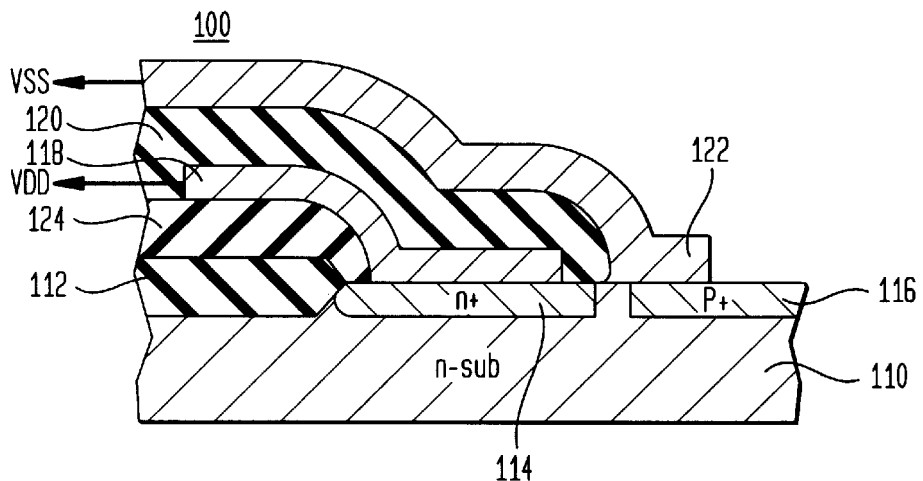
FIG. 2B shows an ESD device according to the present invention.

As shown in FIG. 2A, the protection circuitry 10' of the present invention illustratively comprises a first diode 22' and a second diode 24'. The protective circuitry 10' is similar in construction to the prior art protective circuitry 10 as shown in FIG. 1 in that the components of each protective circuit operate in a similar manner. Inventively, the protective circuitry 10' is fabricated using diodes 22' and 24'. The structure of these diodes is shown more particularly in the diode 100 of FIG. 2B. Illustratively, the diode 100 is formed on an N-substrate 110. A P+ region 116 and a N+ region 114 are formed in the substrate 110. Field Oxide region 112 separates adjacent devices 100 on the substrate. The seal-ring structure is formed of a first insulating region 124, first connection layer 118, a second insulating region 120, and second connection layer 122. The formation of the device of FIG. 2B will now be explained with reference to FIGS. 3A–3H.

Figure 3A:
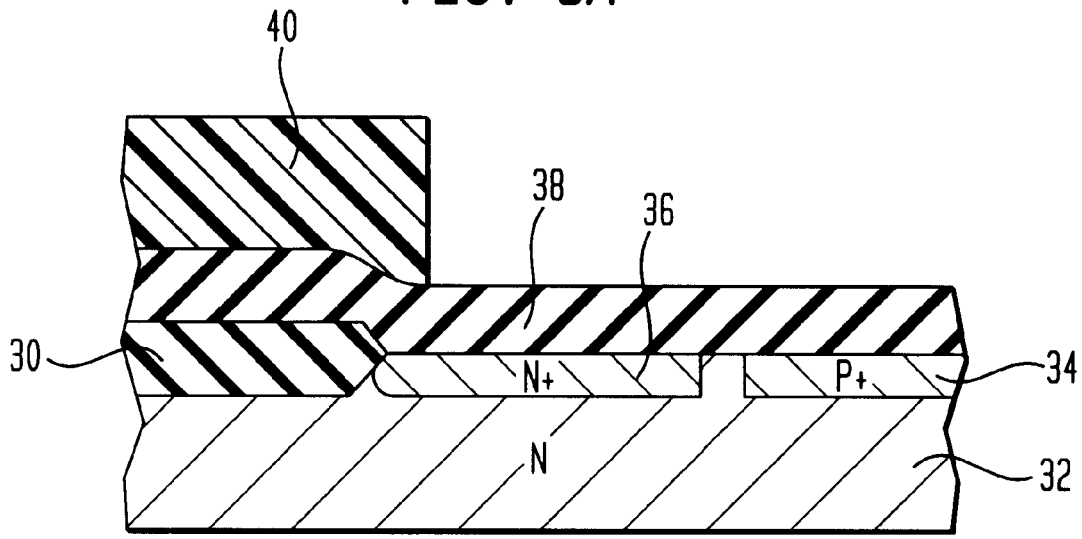
FIG. 3A shows a first step in forming the ESD device of the present invention.

Referring to FIG. 3A, a field oxide layer 30 is grown. This may be accomplished by thermally oxidizing the semiconductor substrate 32 using the well known LOCOS technique. Next, the P+ 34 and N+ 36 regions are formed in the substrate by diffusing P-type and N-type impurities into the substrate. Subsequently, a silicon oxide layer is deposited to form a first insulating layer 38. The first insulating layer 38 is deposited to a thickness of 8000 Å, using, for example, a CVD process. A photo resist pattern 40 is then formed on the first insulating layer 38.

Figure 3B:
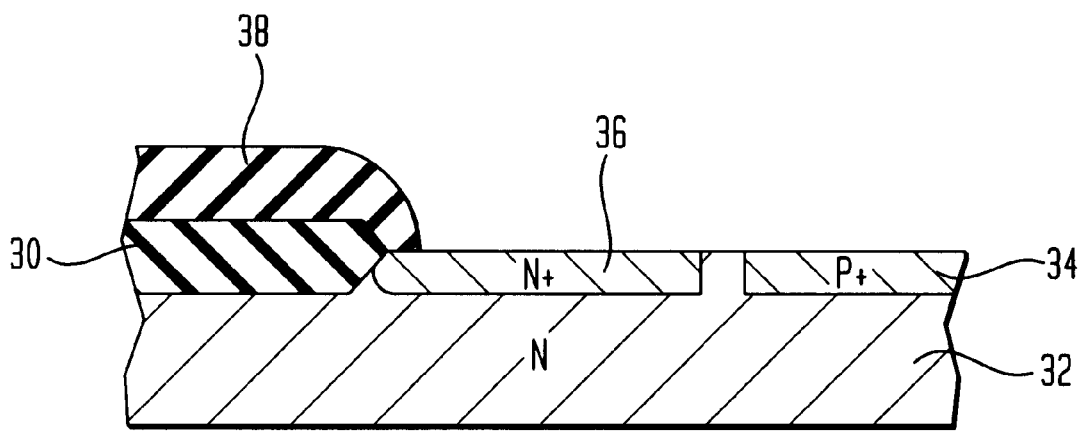
FIG. 3B shows a second step in forming the ESD device of the present invention.
Figure 3C:
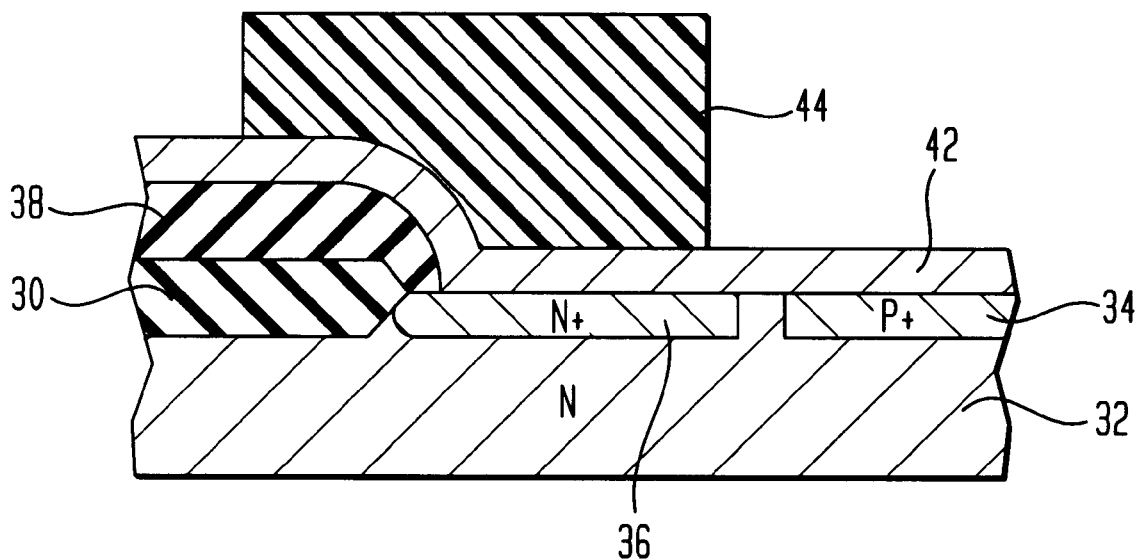
FIG. 3C shows a third step in forming the ESD device of the present invention.
Figure 3D:
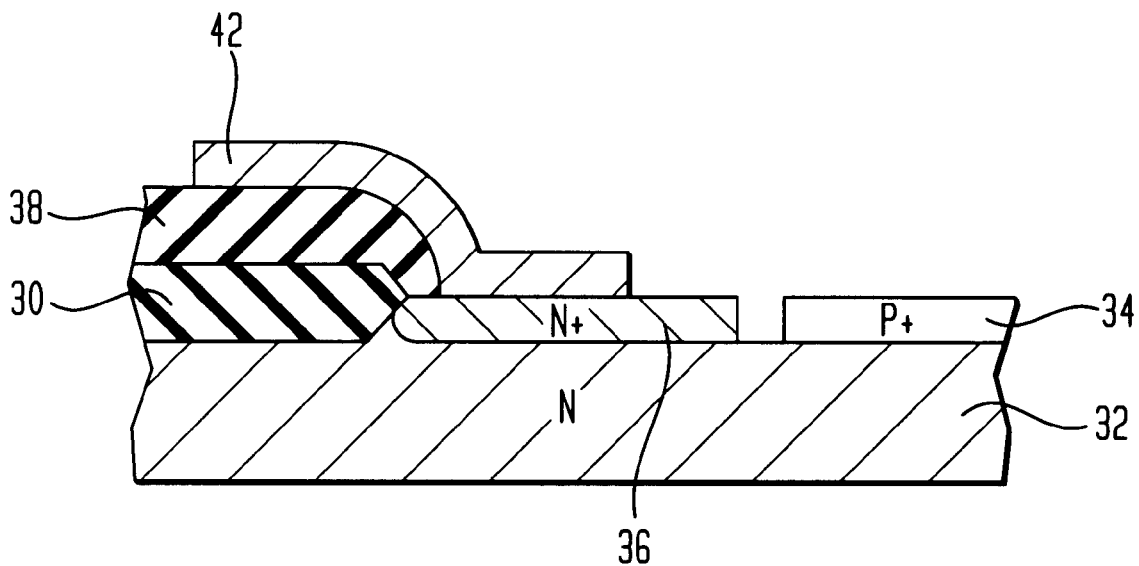
FIG. 3D shows a fourth step in forming the ESD device of the present invention.

Referring now to FIG. 3B, the first insulating layer 38 is etched. The photoresist pattern 40 of FIG. 3A is then removed. As shown in FIG. 3C, a thick aluminum layer 42 is subsequently deposited to form a first connection layer. This layer is deposited using a sputtering process and is formed to a thickness of 5000 Å. Photoresist layer 44 is then formed over the first connection layer 42. Referring now to FIG. 3D, the first connection layer 42 is etched with a mask of the photoresist pattern 44. The photoresist 44 is then removed.

Figure 3E:
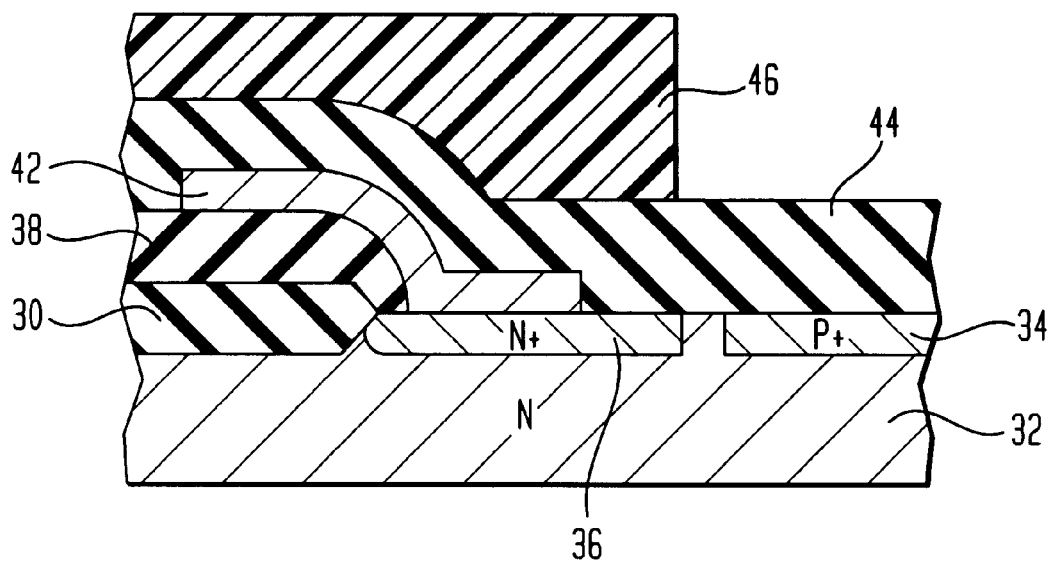
FIG. 3E shows a fifth step in forming the ESD device of the present invention.
Figure 3F:
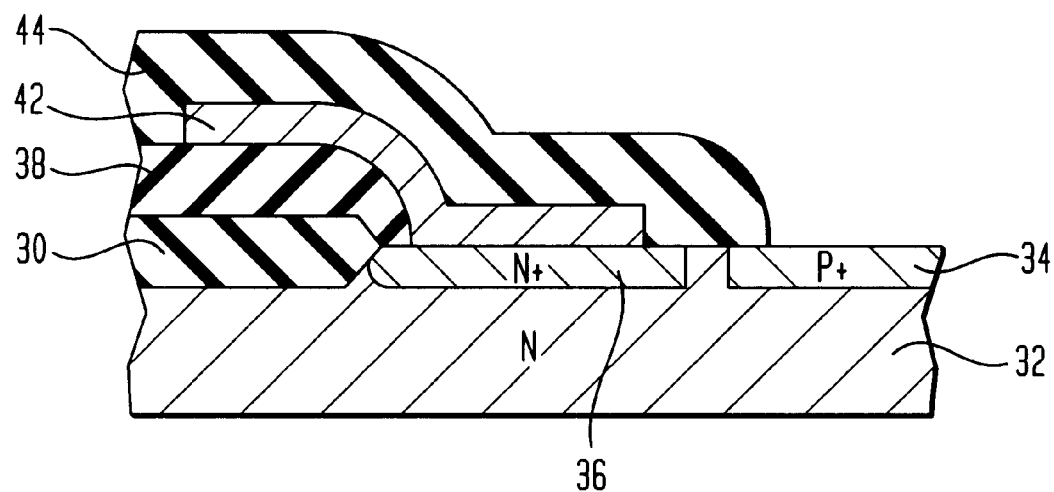
FIG. 3F shows a sixth step in forming the ESD device of the present invention.

Next, referring to FIG. 3E, a second silicon oxide layer 44 is formed over the device. This layer may be formed to a thickness of 8000 Å using a CVD process. Then, formed on the second insulating layer 44 is a photoresist pattern 46. As shown in FIG. 3F, the second insulating layer 44 is etched with a mask of the photoresist pattern 46. The photoresist pattern 46 is then removed.

Figure 3G:
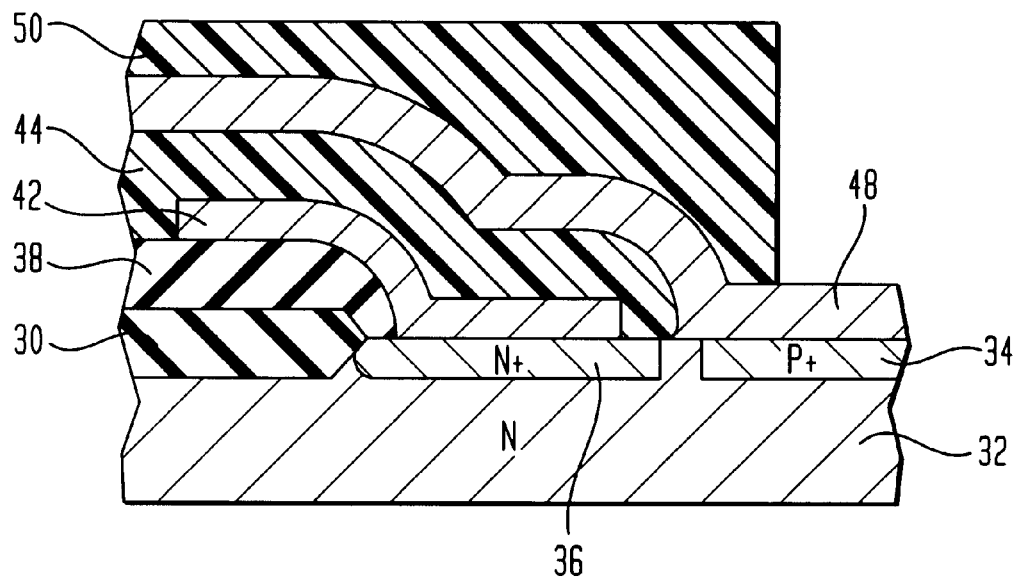
FIG. 3G shows a seventh step in forming the ESD device of the present invention.
Figure 3H:
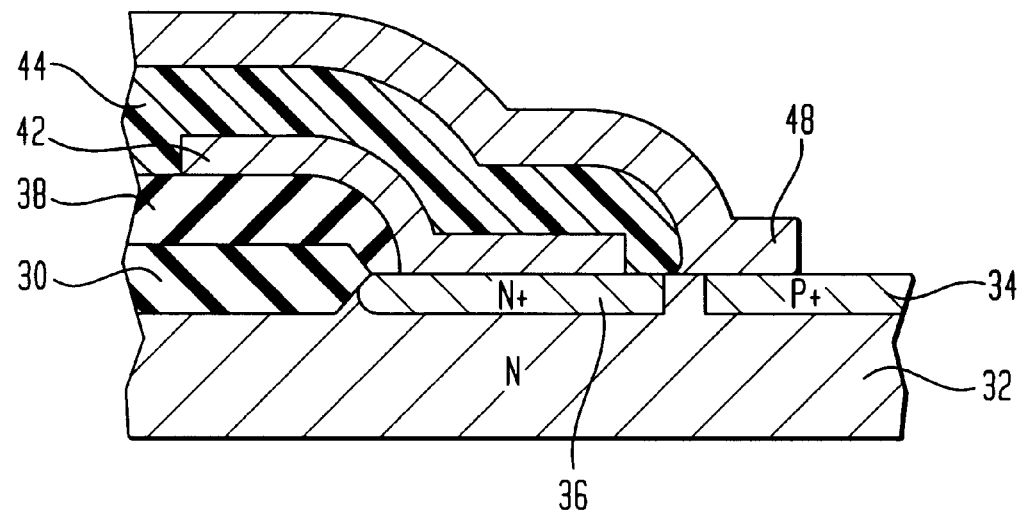
FIG. 3H shows a eighth step in forming the ESD device of the present invention.

Referring now to FIG. 3G, a 1000 Å thick aluminum layer is deposited by a sputtering process to form the second connection layer 48. Then, formed on the second connection layer 48 is a photoresist pattern 50. Next, referring to FIG. 3H, the second connection layer 48 is etched with a mask of the photoresist pattern 50. Thereafter, the photoresist pattern 50 is removed.

Figure 4:
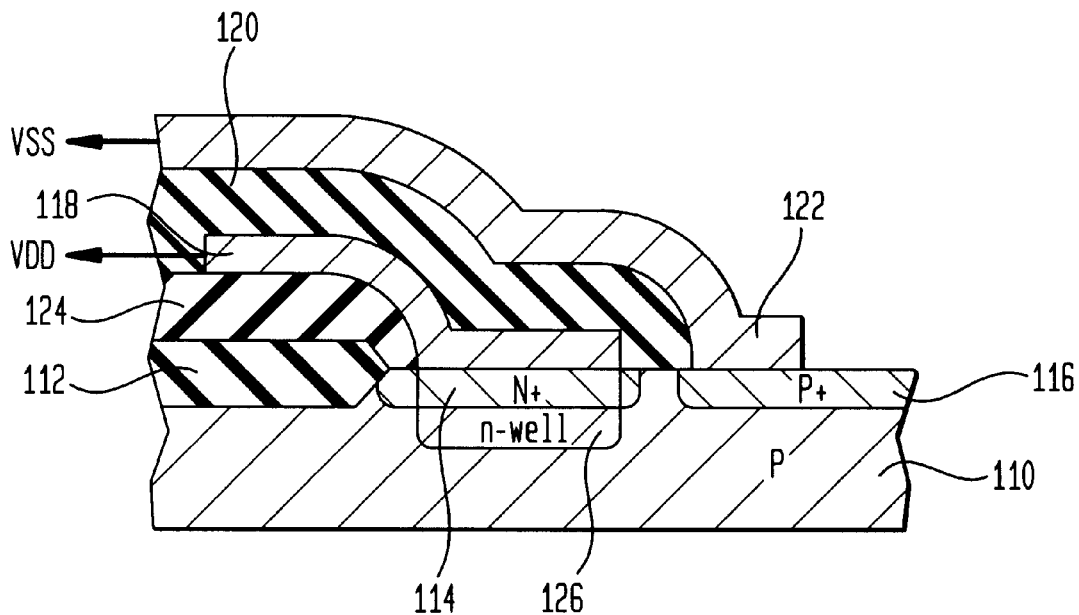
FIG. 4 shows an alternative embodiment of the present invention.
Figure 5:
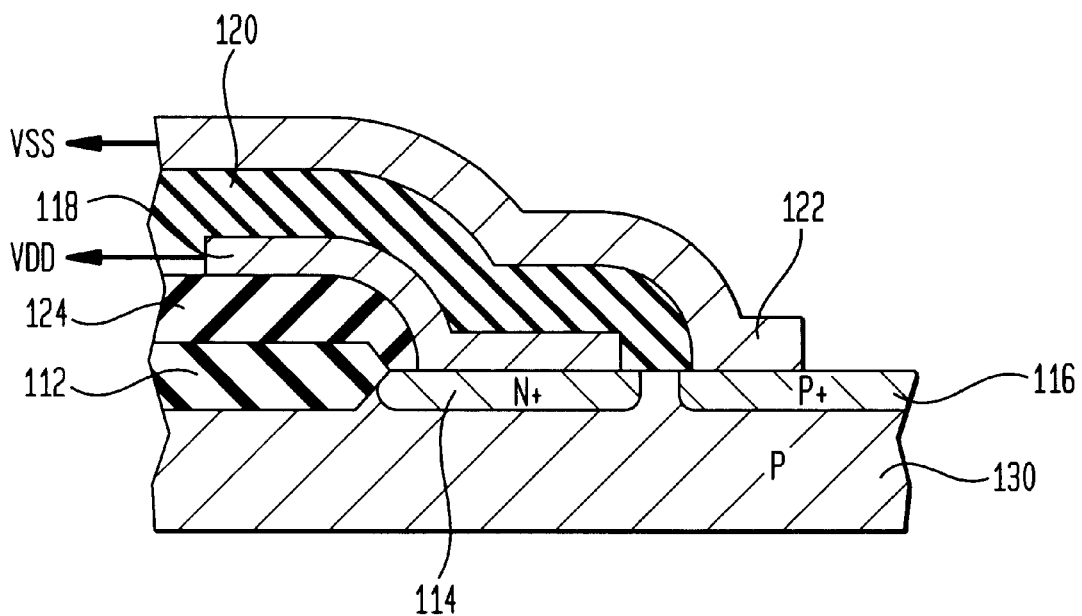
FIG. 5 shows an alternative embodiment of the present invention.
Figure 6:
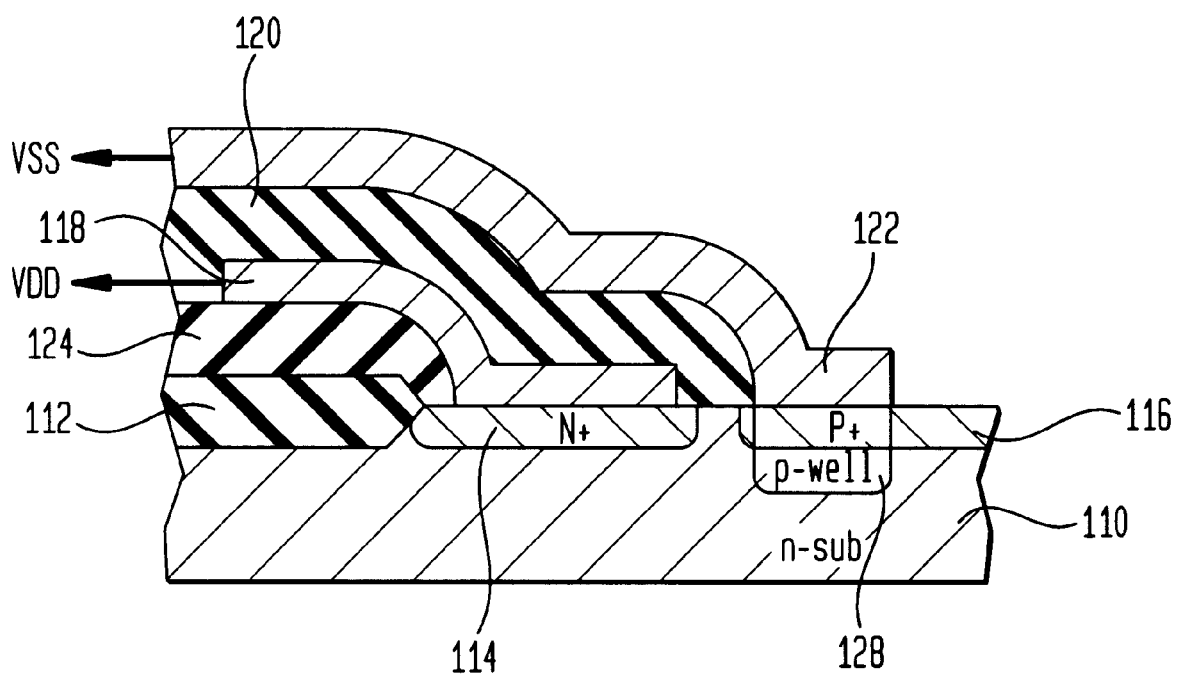
FIG. 6 shows an alternative embodiment of the present invention.

FIGS. 4–6 show other alternative designs of the present device. FIG. 4 shows the device of FIG. 2 with an N-well 126. Similarly, FIG. 6 shows the device of FIG. 2 with a P-well 128. These variations protect against alpha-spiking. In addition, FIG. 5 shows the device of FIG. 2 formed using a P-type substrate 130.

The above-described embodiment of the present invention is intended to be illustrative only. Numerous alternative embodiments may be devised by those skilled in the art without departing from the spirit and scope of the following claims.

What is claimed is:

1. A process for making an Electro-Static Discharge ESD protection device within a seal-ring structure comprising the steps of:

forming a first region of a first conductivity type in a substrate having a second conductivity type opposite of said first conductivity type;

forming a second region of said second conductivity type in said substrate;

forming a first insulating layer over a first portion of said first region;

forming a first connection layer over a second portion of said first region and over said first insulating layer;

forming a second insulating layer over a third portion of said first region, over a first portion of said second region, and over said first connection layer; and forming a second connection layer over a second portion of said second region and over said second insulating layer.

2. The process of claim 1, wherein said substrate is p-type.

3. The process of claim 1, wherein said substrate is n-type.

4. The process of claim 1 further comprising the step of forming a well of said first conductivity type below said first region after said step of forming said first region.

5. The process of claim 1 further comprising the step of forming a well of said second conductivity type below said second region after said step of forming said second region.

* * * * *